(12) United States Patent
Beroz et al.

(10) Patent No.: US 8,039,363 B2
(45) Date of Patent: Oct. 18, 2011

(54) SMALL CHIPS WITH FAN-OUT LEADS

(75) Inventors: Masud Beroz, Cary, NC (US);
Belgacem Haba, Saratoga, CA (US)

(73) Assignee: Tessera, Inc., San Jose, CA (US)

( * ) Notice: Subject to any disclaimer, the term of this patent is extended or adjusted under 35 U.S.C. 154(b) by 394 days.

(21) Appl. No.: 11/588,438

(22) Filed: Oct. 26, 2006

(65) Prior Publication Data

US 2007/0105346 A1 May 10, 2007

Related U.S. Application Data

(63) Continuation-in-part of application No. 11/013,744, filed on Dec. 15, 2004, now abandoned.

(60) Provisional application No. 60/532,339, filed on Dec. 23, 2003.

(51) Int. Cl.
*H01L 21/00* (2006.01)

(52) U.S. Cl. ........ 438/460; 438/106; 438/123; 257/182; 257/661; 257/E33.066; 257/E23.014; 257/E23.031

(58) Field of Classification Search .............. 438/68, 438/33, 107, 113, 460, 461, 462, 463, 464, 438/FOR. 377, FOR. 380, 465, 106, 110, 438/111, 123, 611, FOR. 366, FOR. 369; 257/666, 661, 676, 690, 735, 787, E21.499, 257/E21.511, E21.523, 182, 621, 664, 672, 257/692, 694, 734, 781, E33.066, E23.014, 257/E23.031–E23.034, E23.039, E23.042–E23.043, 257/E23.06, E23.506

See application file for complete search history.

(56) References Cited

U.S. PATENT DOCUMENTS

| | | | |
|---|---|---|---|
| 3,590,478 A * | 7/1971 | Takehana | 438/461 |
| 3,897,627 A | 8/1975 | Klatskin | |
| 4,978,639 A | 12/1990 | Hua et al. | |
| 5,656,553 A * | 8/1997 | Leas et al. | 438/15 |
| 6,107,179 A * | 8/2000 | Zomorrodi et al. | 438/612 |
| 6,630,368 B2 | 10/2003 | Hasegawa et al. | |
| 6,699,102 B2 * | 3/2004 | Reiley et al. | 451/8 |
| 6,759,311 B2 * | 7/2004 | Eldridge et al. | 438/460 |
| 6,835,599 B2 * | 12/2004 | Kuan et al. | 438/111 |
| 6,911,353 B2 * | 6/2005 | Tani et al. | 438/68 |
| 6,972,243 B2 | 12/2005 | Patel | |
| 7,342,297 B1 * | 3/2008 | Tan et al. | 257/666 |
| 2001/0039078 A1 * | 11/2001 | Schroen | 438/123 |
| 2002/0140107 A1 * | 10/2002 | Kato et al. | 257/777 |
| 2003/0067714 A1 * | 4/2003 | Sasaki et al. | 360/126 |
| 2003/0082890 A1 * | 5/2003 | Eldridge et al. | 438/460 |
| 2003/0094677 A1 * | 5/2003 | Cheng | 257/676 |
| 2003/0171011 A1 * | 9/2003 | Li | 439/68 |
| 2004/0107570 A1 * | 6/2004 | Drussel et al. | 29/846 |

* cited by examiner

*Primary Examiner* — Matthew Smith
*Assistant Examiner* — Su Kim
(74) *Attorney, Agent, or Firm* — Lerner, David, Littenberg, Krumholz & Mentlik, LLP (57) ABSTRACT

A method of expanding the contact pitch for un-diced chips in an array by pre-slicing the array in a first direction, attaching a lead frame to the chips' contacts, and then slicing the array and attached lead frame in the second direction. The lead frame has leads mechanically connected one another such that slicing the frame in the second direction along the mechanical connections separates the leads. Each lead has a first terminal which is conductively attached to a chip contact and a second terminal extending beyond the boundaries of the chip to which the first terminal is attached. In this manner, the contact pitch is effectively expanded to the terminal pitch of the leads.

15 Claims, 7 Drawing Sheets

FIGURE 7A  a) pre - dice/score

FIGURE 7B  b) deposit/mask

FIGURE 7C  c) deposit leads

FIGURE 7D  d) dice

SMALL CHIPS WITH FAN-OUT LEADS

CROSS-REFERENCE TO RELATED APPLICATIONS

This application is a continuation-in-part of U.S. patent application Ser. No. 11/013,744 filed Dec. 15, 2004, which claims the benefit of the filing data of U.S. Provisional Patent Application No. 60/532,339 filed Dec. 23, 2003, the disclosure of which is incorporated by reference herein.

FIELD OF THE INVENTION

The present invention relates to a system and method for increasing the ball pitch for very small chips on a wafer by applying fan-out leads which overlap neighboring chips on the wafer.

BACKGROUND OF THE INVENTION

Current trends call for increasingly restrictive chip design rules that call for the chip size to decrease, while also requiring the number of connections to a chip to stay the same or increase. Thus, as chip sizes decrease and the number of connections stays the same or increases, the density of connections to the chip must likewise increase.

For purposes of this application, the distance between a point on a chip (die) and a corresponding point on an adjacent chip lying in a row or column of an array of die on a wafer is referred to as the die pitch. Note, chips and die are referred to interchangeably herein. The contact pitch (CP) of a chip is the distance between adjacent electrical contacts on the chip. Often, fan-outs (leads) are attached to the contacts of a chip. The electrical connections of the fan-out are referred to as terminals. The terminal pitch (TP), or ball pitch (BP) when solder balls are placed on the terminals, is the distance between adjacent terminal connection points. The pad pitch (PP) is the distance between adjacent pads on a chip package or printed wiring board (PWB).

Conventional solutions to this connection density problem are usually directed to modifying the wire bonding between the chip and its packaging, or prepackaging the chip for later assembly on a printed wiring board. However, these solutions are inadequate to continue addressing this problem; particularly as chip designs evolve.

SUMMARY OF THE INVENTION

One aspect of the present invention provides a method of processing chips connected in a two-dimensional array. Preferably, the array of chips is sliced along first slicing paths which extend in a first or X-direction, thus subdividing the array into rows of connected chips. A lead frame may be attached to contacts on the chips in the rows of connected chips. The lead frame preferably has a plurality of leads mechanically connected to one another. Each lead preferably has a first terminal conductively attached to a contact on the chip and a second terminal extending beyond a boundary of the chip to which the first terminal is attached. The leads may extend in a second or Y-direction transverse to the first or X-direction. The rows of connected chips and the attached lead frame may then be sliced along slicing paths which extend in the second or Y-direction, thereby separating the rows into individual chips. The slicing step desirably also separates the individual leads connected to the contacts on the individual chips from the lead frame. In preferred methods according to this aspect of the invention, the contact pitch of the chips can be effectively expanded to the terminal pitch defined by the distance between the second terminals of the leads. Because the second terminals of the leads attached to each chip can extend beyond the boundaries of the chip, the terminal pitch may be larger than the size of the chip itself.

The two-dimensional array may be a wafer or a portion of a wafer, and the array may be attached to a substrate before the first slicing step. The second terminals may extend over the boundaries of adjacent chips in the wafer array. Solder balls may be attached to the second terminals ends.

Another aspect of the present invention is directed to a method of producing leaded chips by connecting leads to contacts on chips in an array, so that at least some of the leads connected to each chip extend across at least one boundary between that chip and an adjacent chip in the array. The individual chips are then separated from the array so that the leads connected to each chip remain during the connecting step remain connected to that chip after the separating step.

The array according to this aspect may have a one or more sacrificial regions mechanically connecting at least some of the chips to one another. The step of separating individual chips from the array may include removing the sacrificial regions. The chips may have front surfaces and the contacts may be exposed at the front surfaces. A sacrificial layer may overlie these front surfaces. The leads may be connected to the exposed contacts and may extend over the sacrificial layer. The array may be formed from a unitary wafer element including a plurality of chips by providing the sacrificial layer on the wafer element and then at least partially cutting through the wafer element along at least some boundaries between adjacent chips.

The array may include one or more columns of chips extending in a Y-direction and one or more rows of chips extending in an X-direction transverse to the Y-direction. The step of connecting leads to chips may performed so that at least some of the leads connected to each chip have terminal ends projecting beyond that chip in the Y-direction. The chips within each column of the array may be physically attached to one another only by a temporary structure at the time the leads are attached. The step of separating the chips from the array may include removing this temporary structure. For example the temporary structure may be connected to the rear surfaces of the chips. The step of connecting leads may be performed so that the leads overlie the front surfaces of the chips. At least some of the chips in each row may be integral with chips of the same row. The array may be formed by connecting a unitary wafer element including a plurality of chips to the temporary structure and severing the wafer element along severance lines extending in the X-direction.

The step of connecting the leads to the chips may include attaching a lead unit to the array. At least some of the mechanical connections may be severed during the step of separating the chips from the array. For example, the step of separating the chips from the array may include severing the chips of each row from one another by slicing the array and the lead unit along severance lines extending in the Y-direction.

BRIEF DESCRIPTION OF THE DRAWINGS

These and other features, aspects, and advantages of the present invention will become better understood with regard to the following description, appended claims and accompanying drawings where:

DESCRIPTION OF THE INVENTION

As further discussed below, certain embodiments expand the contact pitch of a very small chip die by attaching conductive leads to the chip which extend beyond the physical boundaries of the chip. The contact pitch may be enlarged at the wafer level by extending leads beyond the physical boundaries of the chip. The requirement for a high resolution pad pitch on very small chip packages can be alleviated. For example, flip chipping and other packaging techniques for small die (~200 to 300 um in size) become problematic when the contact pitch conflicts with the design rule limitations of the printed wiring boards or other substrates to which the dies are to be attached.

Consider a hypothetical case where a chip is to be mounted on a pad having a pad pitch of 100 microns with a spacing of 10 microns between each pad and the design rules dictate a PWB with 100 micron lines and spacing. A pad pitch of 100 microns is pushing the capabilities of the state of the art in PWB manufacturing. In order to accommodate flip chip mounting a chip with a smaller pad pitch, the chip would first need to be packaged individually onto a secondary substrate.

As described herein, certain preferred embodiments of the present invention effectively can expand the contact pitch of chips by processing at the wafer level. The chips can then be picked-up and placed directly onto a conventional, relatively inexpensive PWB or other substrate.

Figure 1:
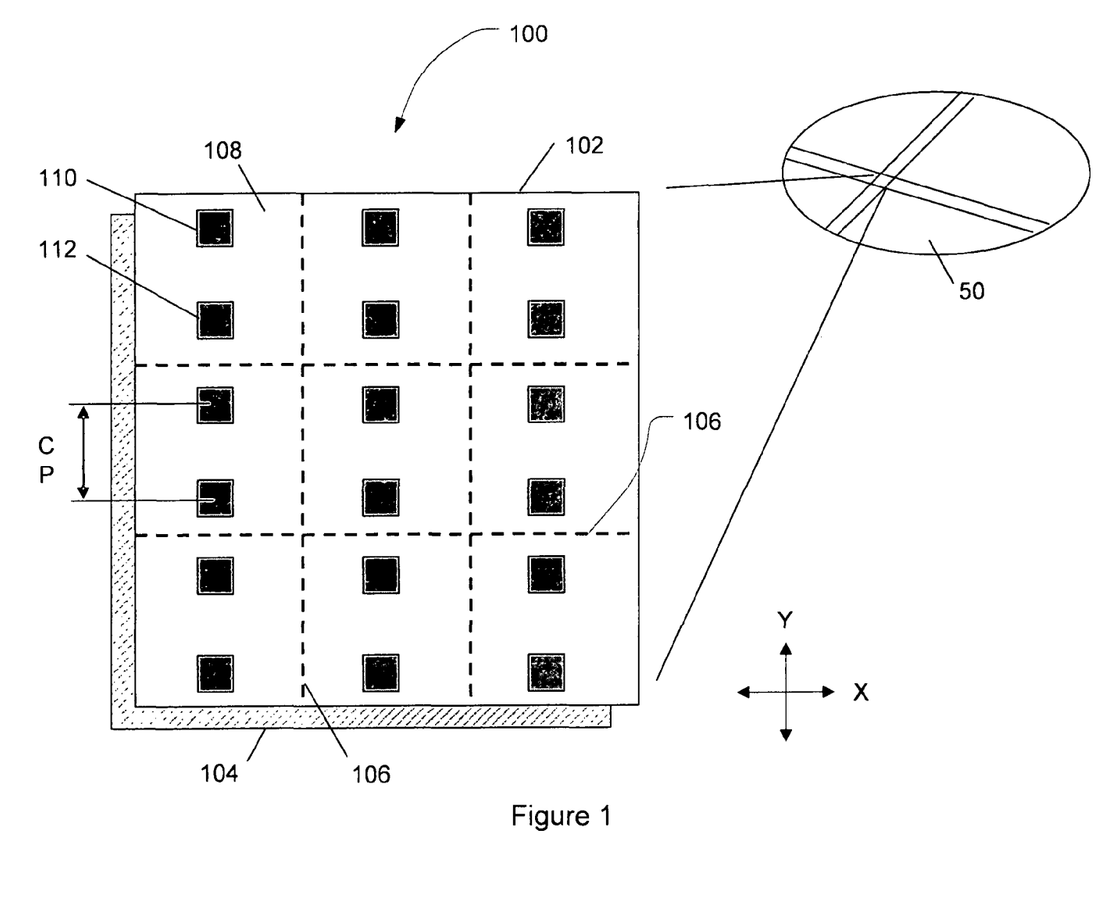
FIG. 1 is a top plan view depicting a portion of a wafer assembly containing an exemplary 3×3 array of small chips.

FIG. 1 illustrates a unitary portion 100 of a wafer 50. Portion 100 contains an exemplary 3×3 unit 102 of nine individual dies or chips 108 formed integrally with one another. The unitary wafer portion includes three columns of chips, the columns extending in a direction designated as the Y-direction and indicated by the arrow Y in FIG. 1. The unit also includes rows of chips extending in the X-direction shown by arrow X in FIG. 1, perpendicular to the Y-direction. The boundaries between the individual chips 108 are indicated in FIG. 1 by lines 106 for clarity of illustration. In actual practice, the boundaries may or may not be visible at this stage. The present invention may be applied to various sized arrays, including an array of chips constituting an entire wafer 50. In this example, each individual chip 108 has only two input/output contacts (I/O's) 110, 112, these contacts being exposed at the front surfaces of the chips, i.e., the surfaces facing toward the viewer in FIG. 1. The distance between the two contacts in each chip is referred to as the contact pitch (CP). In the condition shown in FIG. 1, array 100 has a temporary substrate 104 mounted onto the rear surfaces of the chips. The substrate is preferably a polymeric dicing tape, such as the dicing tape sometimes referred to as "green tape," which may be stretchable with an adhesive coating.

Figure 2:
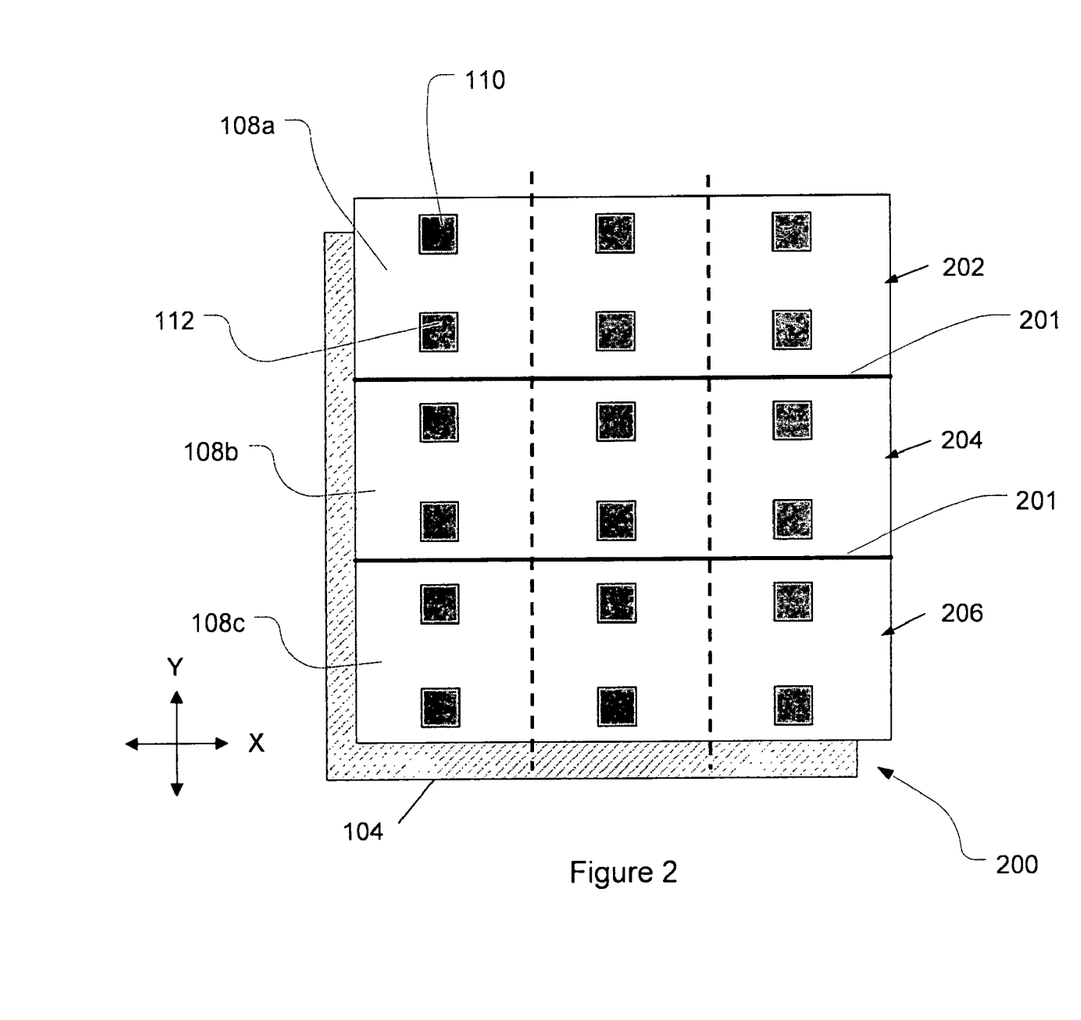
FIG. 2 is a top plan view depicting the exemplary 3×3 array of FIG. 1 sliced in the X-direction into three rows.

As shown in FIG. 2, the unitary wafer portion of FIG. 1 is sliced along first slicing paths 201 extending in the X-direction, thus subdividing the unitary wafer portion into three rows 202, 204, 206 and forming the array 200 used in subsequent process steps. The slices preferably cut only through the array and do not cut through the substrate, so that the uncut substrate keeps the rows in position relative to one another within the array. In this condition, the dies of each row remain mechanically connected to one another by the structure of the wafer portion itself. However, dies in different rows are mechanically connected to one another only by temporary substrate 104. For example, dies 108a, 108b and 108c, constituting one column of the array of dies are connected to one another only by the temporary substrate 104.

Figure 3:
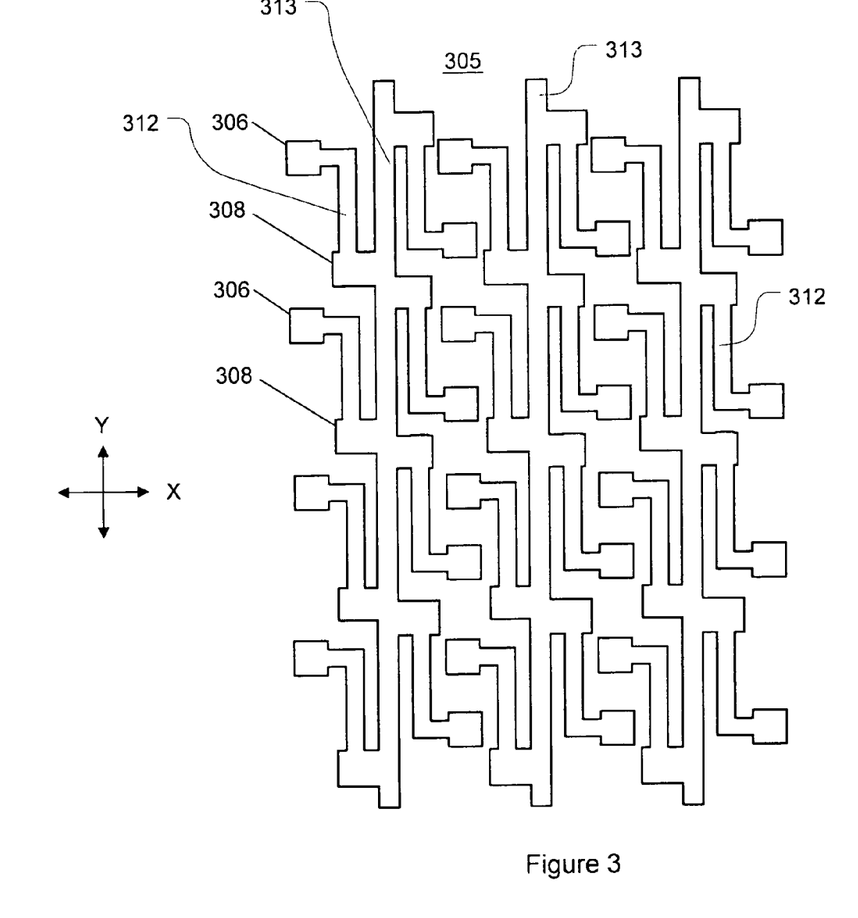
FIG. 3 is a plan view depicting an exemplary lead frame which may be attached to the exemplary 3×3 array of FIG. 2.

In the next step of the process according to this embodiment, a lead unit including a plurality of leads mechanically connected to one another attached to the array 200. In this embodiment, the lead unit is a lead frame 305 depicted in FIG. 3. Lead frame 305 contains a repeating pattern of leads 312 which are interconnected with one another by interconnecting members 313. Each lead has a first terminal 306 and a second terminal 308. The second terminals 308 of the leads are connected to the interconnecting members 313. The interconnecting members 313 optionally may be connected to one another by further members (not shown) outside of the area occupied by the terminals and leads so that the lead frame, in this condition, forms a coherent whole. As shown in FIG. 3, the interconnect members extend generally parallel to one another.

Figure 4:
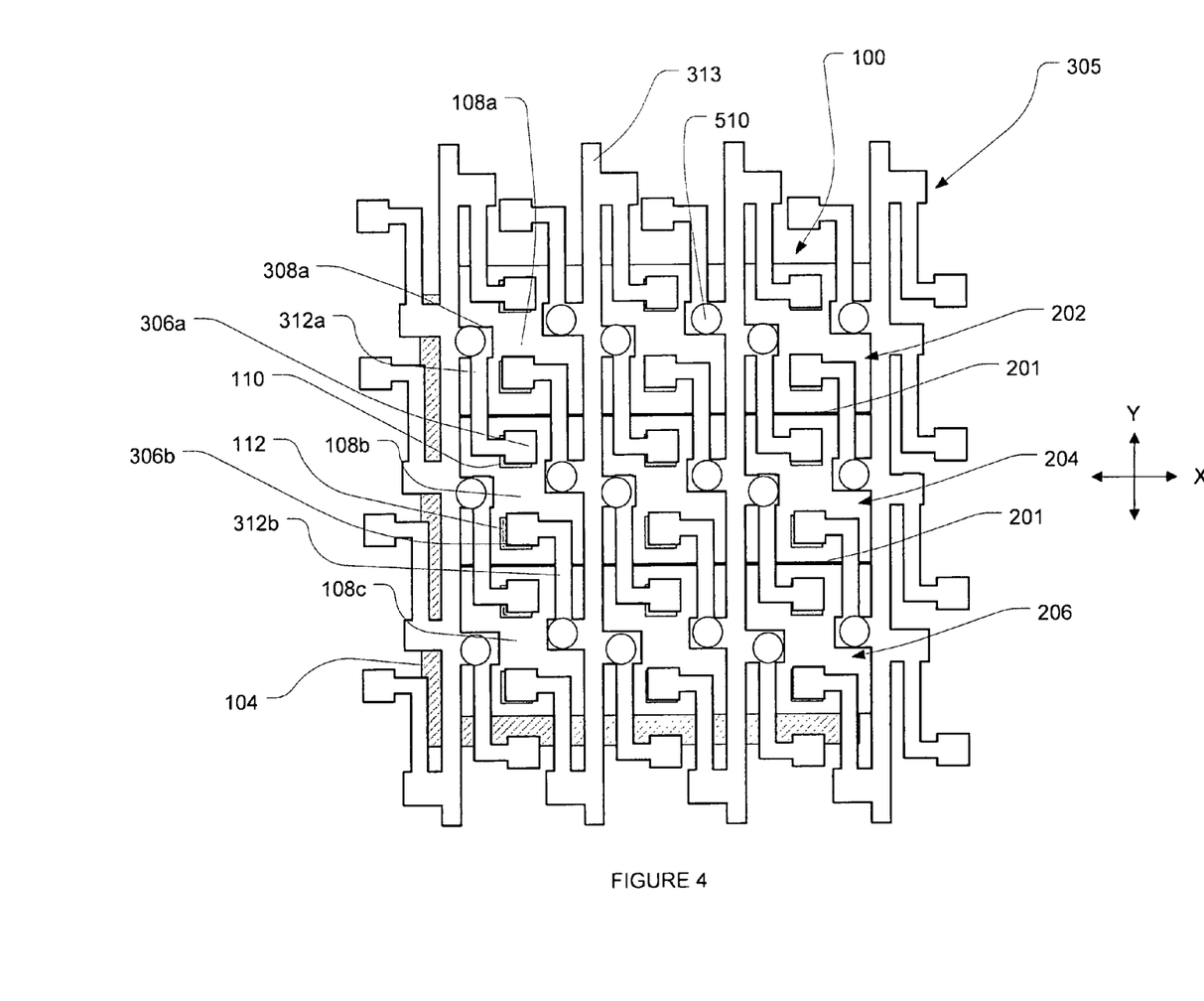
FIG. 4 is a top plan view depicting the lead frame of FIG. 3 mounted on the array of FIG. 2.

As shown in FIG. 4, the lead unit or lead frame 305 is attached to the array of chips 100. The first terminal 306 of each lead 312 is aligned with and connected to a contact on a chip. The leads 312 extend generally in the Y-direction of the array. Each lead 312 extends across a boundary of the chip to which it is connected. For example, lead 312a has its first terminal 306a connected to contact 110 of chip 108b in the second row 204 of the array. This lead extends in the Y direction across the boundary of chip 108b, and across one of the first slicing paths 201, so that the second terminal 308a of this lead is disposed over chip 108a in the first row 202 of the array. Second terminal 308a is not attached to chip 108a. Lead 312b, which has its first terminal 306b connected to the other contact 112 of the same chip 108b, extends across the opposite boundary of chip 108b and extends across another one of the first slicing paths 201 so that the second terminal 308b of this lead is disposed over chip 108c in the third row 206. Second terminal 308b is not attached to chip 108c.

The interconnect members 313 also extend in the Y direction, and overlie the boundaries between the chips of adjacent columns.

As also shown in FIG. 4, solder balls 510 may be attached to the second terminals 308 on the lead frame 305 mounted on the array 100. The solder balls may be subsequently connected to a substrate such as a substrate which forms part of the chip's packaging or a printed wiring board (not shown). Solder balls are optional and other conductive bonding materials may or may not be used.

Figure 5:
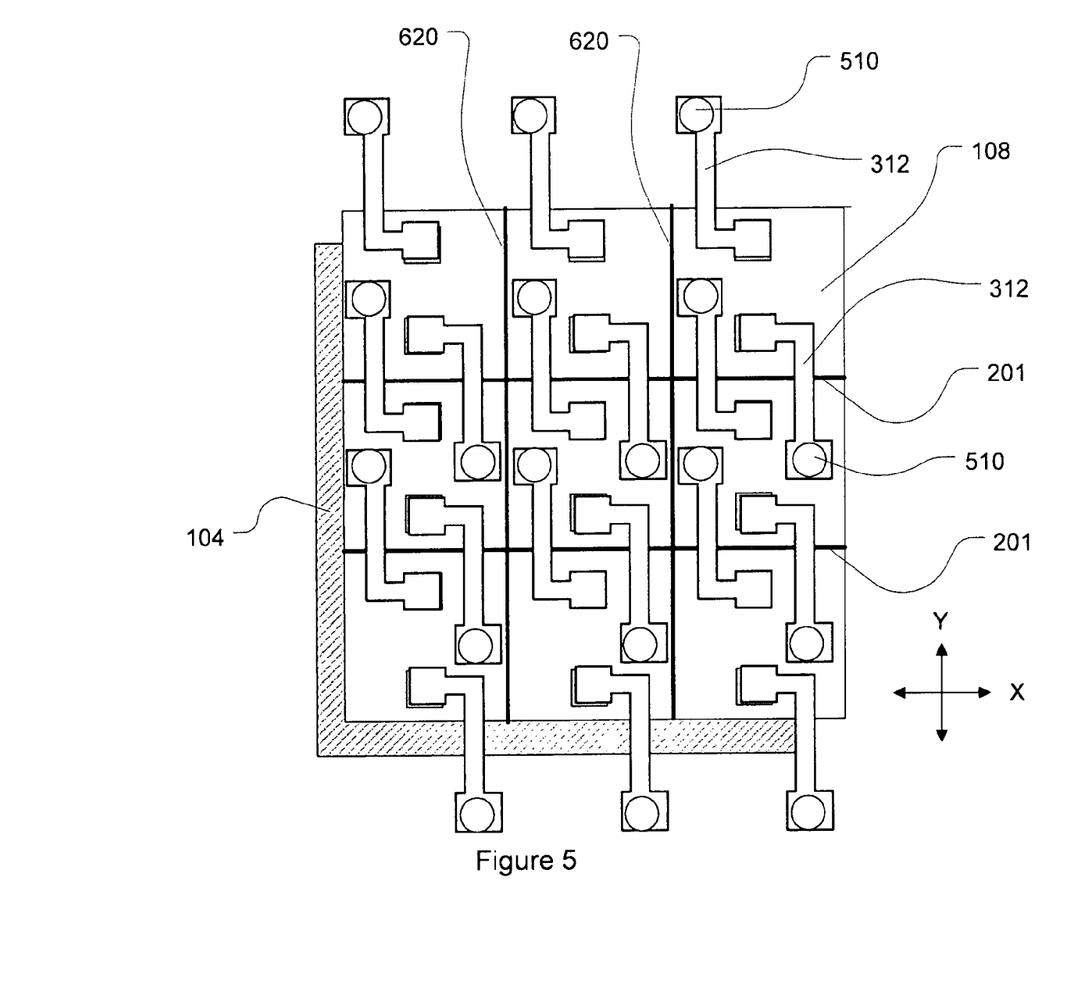
FIG. 5 is a top plan view depicting the array and lead frame, as shown in FIG. 4, after slicing in the Y-direction to produce a set of 9 separate die with attached leads.

After the lead frame is attached to the array, the lead frame and the underlying attached array are then sliced along second slicing paths 620 (FIG. 5) extending in the Y-direction along the boundaries between adjacent columns. The slicing operation removes the interconnect elements 313 (FIG. 4) and thus mechanically and electrically disconnects the various leads 312 of the lead unit from one another. As shown in FIG. 5, the Y-direction slicing along second slicing paths 620 has separated the leads from each other, and has also separated the chips of adjacent columns from one another. As the array was previously sliced in the X-direction along first slicing paths 201 (before applying the lead frame), the Y-direction slicing separates each of the chips 108 (in this case a set of 9 separate chips) with attached leads 312 and solder balls 510. Again, the slices preferably cut only through the wafer portion of the array and do not cut through the temporary substrate 104, so that the temporary substrate keeps the cut die in their relative positions. Various techniques can be used to release the individual chips from the substrate; including an ultraviolet (UV) release, or by using a push pin through the back of the substrate.

Figure 6A:
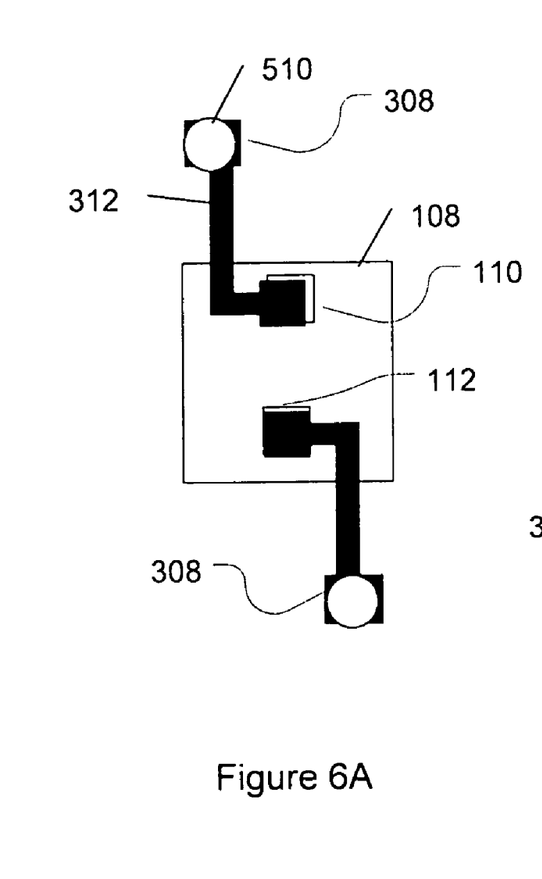
FIG. 6A is a plan view depicting an individual chip formed from the array of FIG. 5.

FIG. 6A illustrates an individual chip 108 separated from the array after dicing. The chip has leads 312 electrically connected to its contacts 112. Each lead projects beyond the boundary of the chip, and has its second terminal 308, carrying a solder ball 510, disposed outside of the perimeter of the chip. Stated another way, those leads 312 which were connected to the chip 108 during the step of attaching the lead unit or lead frame remain connected to the chip after the chips are separated from one another.

Figure 6B:
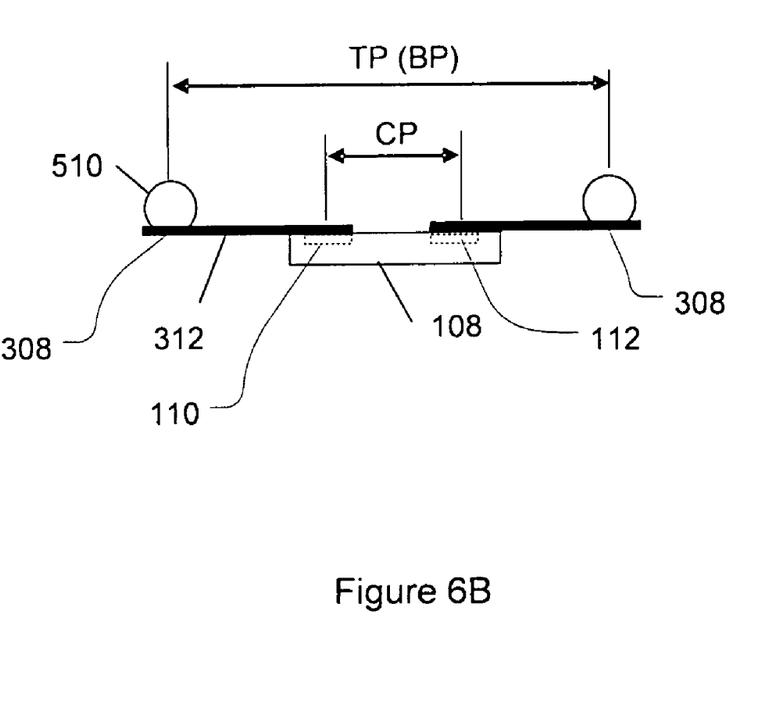
FIG. 6B is a side view of the chip shown in FIG. 6A to show the relative expansion, or fan out, from the original contact pitch (CP) to the terminal pitch (TP), or ball pitch (BP).

FIG. 6B illustrates a side view of an individual chip 108 to show the relative expansion, or fan out, due to the attached leads 312 from the original contact pitch (CP) to the terminal pitch (TP), or ball pitch (BP). As can be seen, the pitch expansion may be a factor of two or more greater than the original CP. This pitch expansion facilitates handling and mounting of the individual chips to substrates such as circuit panels.

Numerous variations of the features discussed above can be employed. For example, the leads of the lead frame may be separated from one another by etching or by another process, rather than by the slicing operation. In this case, the die can be sliced in the Y-direction after the leads have been separated or the die can be sliced in both the X-direction and Y-direction before the lead frame is attached. Other lead frame configurations are envisioned, including lead frames which may be sliced in different directions and for attachment to chips having more than two contacts. The lead frame may be fabricated from another wafer which could then be mounted onto the wafer assembly. Moreover, the lead unit which is attached to the array need not include a lead frame. For example, the lead frame could be replaced with a flex tape or any other similar substrate carrying the leads. In this case as well, the individual leads of the lead unit may be separated from one another either by the slicing process used to separate the chips of the array from one another, or by other processes. The invention can be applied to applications with multiple I/O's and larger die or other configurations where the interconnection of individual die with outside media is problematic or where the outside connections are too numerous for a given chip size.

FIGS. 7A-7D illustrate an exemplary sequence for processing a substrate 701 incorporating small chips according to another embodiment of the present invention. As shown in FIG. 7, two individual chips 701a and 701b in a wafer substrate 701 are separated by a sacrificial region 701c. The wafer 701 is pre-diced or scored 703 between the individual chips 701a and 701b. The scoring 703 may be a result of patterning when processing the multi-chip wafer. A sacrificial layer, or thin film, 711 (FIG. 7B) is then deposited or applied on the top surface of the wafer. This layer or thin film 711, which may be a resist layer or an inorganic layer such as an oxide or nitride thin film, is suitably masked and patterned to allow for electrical leads 721 to be deposited on the individual chips 701a and 701b of the wafer 701. The bond of the sacrificial layer 711, (i.e., the dielectric or mask) to the die desirably does not result in adhesion of the dielectric layer to a neighboring die when the chips are later separated from one another. This is especially important when radiation based separation and release methods such as ultraviolet separation processes are used. are used.

Figure 7A:
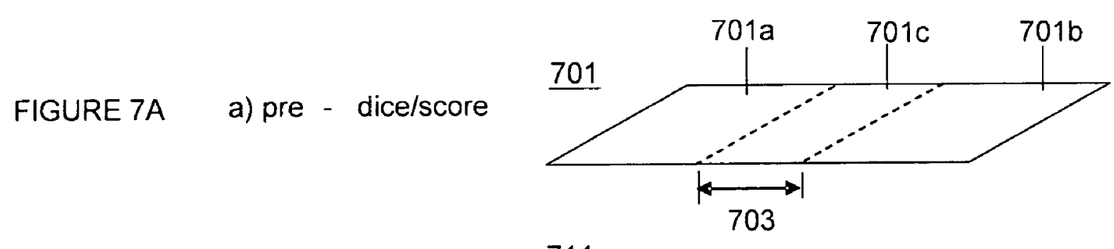
FIGS. 7A-7D are diagrammatic perspective views illustrating an exemplary sequence for processing a substrate of small chips according to a further embodiment of the invention.
Figure 7B:
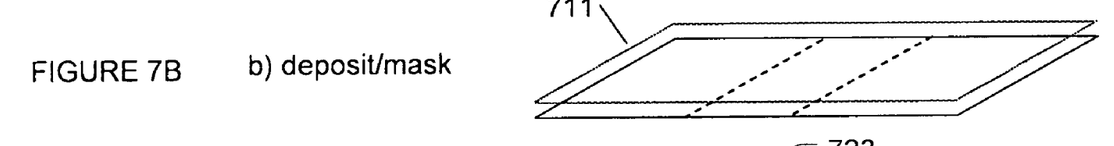
Figures 7C, 7D:
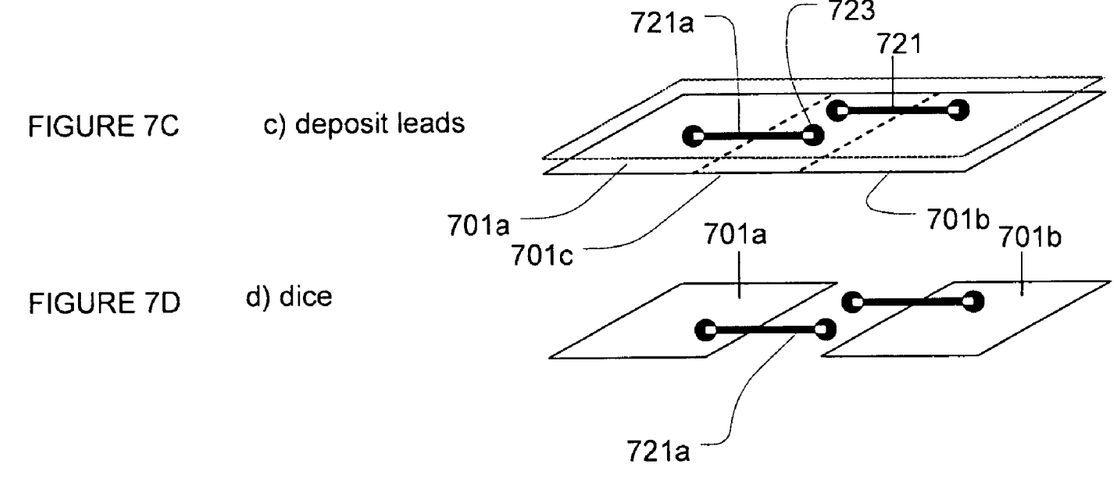

After deposition of the sacrificial layer, a conductive material may then be deposited to form leads 721 on top of sacrificial layer 711. The leads extending through the sacrificial layer 711 to the contacts of the underlying chips 701a, 701b. In this embodiment as well, the each lead extends beyond the boundaries of the chip to which it is connected. For example, lead 721a is connected to a contact of chip 701a, and extends beyond the boundary of that chip, so that a terminal 723 of the lead lies over the sacrificial region 701c. The sacrificial layer may or may not be etched away after the leads are formed. The individual die are then separated; for example by ultrasonic slicing. The individual chips are typically on the order of millimeters or less in size. If the sacrificial layer was not previously removed, the wafer may be sliced from the back without slicing through the sacrificial layer thereby protecting the leads which cross over the die boundaries. The sacrificial layer can then be removed by etching without harming the leads. In this embodiment as well, each lead remains attached to the particular chip to which that lead was originally connected. For example, lead 721a remains attached to chip 701a. The resulting circuitized, diced chips are useful as, for example, sensors, RFIDs, and the like. In a particular embodiment, leads 721 from each chip will extend over neighboring chip surfaces but are not permanently bonded to the neighboring chip surface. For example, terminal 723 may be disposed over chip 701b, but will not remain attached to chip 701b after the sacrificial layer 711 is removed.

The invention has been described in the context of extended interconnections that connect at one end to a die, and that extend to another location where a conductor such as a solder ball can be mounted for connection to outside packaging. The invention, however, can be extended to equivalents where extended interconnections are useful. Such equivalents will be understood as within the spirit and scope of the invention, which is defined by the appended claims and equivalents.

The invention claimed is:

1. A method of processing chips connected in a two-dimensional array, comprising the steps of:
    slicing the array of chips along first slicing paths which extend in a first direction to thereby subdivide the array into a plurality of rows of connected chips, each said row including a plurality of connected chips;
    attaching a lead frame to contacts on the plural chips in the plural rows of connected chips; said lead frame comprising a plurality of leads mechanically connected to one another prior to the attaching step; each lead having a first terminal conductively attached to a contact on one of the chips and a second terminal extending beyond a boundary of the chip to which said first terminal end is attached; and
    slicing the rows of connected chips and the attached lead frame along second slicing paths which extend in a second direction perpendicular to the first direction, thereby separating the rows into individual chips and separating the individual leads connected to the contacts on the individual chips from the lead frame while leaving at least some of the leads connected to each chip extending across a boundary of that chip.

2. The method according to claim 1, further comprising the step of attaching the array to a substrate before slicing the array along the first slicing paths.

3. The method according to claim 1, wherein, after the step of attaching the lead frame, the leads extend over the first slicing paths.

4. The method according to claim 1 wherein, after the step of attaching the lead frame, the leads connected to chips in each row extend over the boundaries of chips in adjacent rows.

5. The method according to claim 1, further comprising the step of attaching solder balls to the second terminals.

6. The method according to claim 1, wherein a contact pitch of the chips is expanded to a terminal pitch defined by the distance between the second terminals of the leads.

7. The method according to claim 1, wherein the two-dimensional array is at least a portion of a complete wafer.

8. The method according to claim 1 wherein, the lead frame includes connecting members and wherein, after the step of attaching the lead frame, the connecting members of the lead frame extend in the second direction.

9. The method according to claim 8 wherein the second slicing paths are coincident with the connecting members of the lead frame.

10. A method of producing leaded chips, comprising the steps of:
   connecting leads to contacts on chips in an array so that at least some of the leads connected to each chip extend across at least one boundary between that chip and an adjacent chip in the array; and
   separating individual chips from the array so that the leads connected to each said chip in the connecting step remain connected to that chip after the separating step;
   wherein said step of connecting said leads to said chips includes attaching a lead unit to said array; said lead unit including a plurality of leads mechanically interconnected to one another prior to the attaching step, the step of separating the chips from the array including severing the mechanical interconnections of the lead unit while leaving at least some of the leads connected to each chip extending across a boundary of that chip.

11. The method according to claim 10, wherein said array includes at least one column of chips extending in a Y-direction, and wherein the step of connecting leads to chips is performed so that at least some of the leads connected to each chip have terminals projecting beyond that chip in the Y-direction.

12. The method according to claim 11, wherein the chips within each said column of said array are physically attached to one another only by a temporary structure at the time the leads are attached, the step of separating the chips from the array including removing said temporary structure.

13. The method according to claim 12, wherein the temporary structure is connected to rear surfaces of the chips, the step of connecting leads being performed so that the leads overlie front surfaces of the chips.

14. The method according to claim 12, further comprising the step of forming the array by connecting a unitary wafer element including a plurality of chips to the temporary structure and severing the wafer element along severance lines extending in an X-direction transverse to the Y-direction.

15. The method according to claim 12, wherein said array includes a plurality of rows of chips, each row extending in an X-direction transverse to the Y-direction, the rows being offset from one another in the Y-direction, the step of separating the chips from the array including severing the chips of each row from one another.

* * * * *